(12) United States Patent
MacDonald et al.

(10) Patent No.: US 8,807,203 B2
(45) Date of Patent: Aug. 19, 2014

(54) TITANIUM-BASED THERMAL GROUND PLANE

(75) Inventors: Noel C. MacDonald, Santa Barbara, CA (US); Carl D. Meinhart, Santa Barbara, CA (US); Changsong Ding, Goleta, CA (US); Payam Bozorgi, Goleta, CA (US); Gaurav Soni, Pasadena, CA (US); Brian D. Piorek, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 624 days.

(21) Appl. No.: 13/055,111

(22) PCT Filed: Jul. 21, 2009

(86) PCT No.: PCT/US2009/051285
§ 371 (c)(1),
(2), (4) Date: Jan. 20, 2011

(87) PCT Pub. No.: WO2010/036442
PCT Pub. Date: Apr. 1, 2010

(65) Prior Publication Data
US 2011/0120674 A1    May 26, 2011

Related U.S. Application Data

(60) Provisional application No. 61/082,437, filed on Jul. 21, 2008.

(51) Int. Cl.
*F28D 15/04*      (2006.01)
*H05K 7/20*       (2006.01)
(52) U.S. Cl.
USPC ............................... 165/104.26; 165/104.21

(58) Field of Classification Search
CPC ....................... F28D 15/046; H05K 7/20336
USPC .......... 165/104.26, 104.21; 361/700; 257/715
See application file for complete search history.

(56) References Cited

U.S. PATENT DOCUMENTS

| | | | | |
|---|---|---|---|---|
| 6,070,656 A | * | 6/2000 | Dickey .................... | 165/104.26 |
| 6,477,045 B1 | * | 11/2002 | Wang ............................ | 361/700 |
| 6,827,134 B1 | * | 12/2004 | Rightley et al. .......... | 165/104.26 |
| 6,903,929 B2 | | 6/2005 | Prasher et al. | |
| 6,957,692 B1 | * | 10/2005 | Win-Haw et al. ........ | 165/104.33 |
| 2004/0011512 A1 | * | 1/2004 | Noda et al. ............... | 165/104.26 |
| 2004/0087057 A1 | | 5/2004 | Wang et al. | |
| 2005/0230085 A1 | * | 10/2005 | Valenzuela .............. | 165/104.26 |
| 2005/0280162 A1 | * | 12/2005 | Mok et al. .................... | 257/778 |
| 2006/0213648 A1 | * | 9/2006 | Chen et al. ............... | 165/104.33 |
| 2007/0051499 A1 | * | 3/2007 | Kaimura et al. .......... | 165/104.19 |
| 2007/0053168 A1 | | 3/2007 | Sayir et al. | |
| 2007/0068615 A1 | * | 3/2007 | Chien .......................... | 156/73.5 |

(Continued)

OTHER PUBLICATIONS

PCT/US2009/051285 International Search Report.

*Primary Examiner* — Tho V Duong
(74) *Attorney, Agent, or Firm* — Gates & Cooper LLP

(57) ABSTRACT

Titanium-based thermal ground planes are described. A thermal ground plane in accordance with the present invention comprises a titanium substrate comprising a plurality of pillars, wherein the plurality of Ti pillars can be optionally oxidized to form nanostructured titania coated pillars, and a vapor cavity, in communication with the plurality of titanium pillars, for transporting thermal energy from one region of the thermal ground plane to another region of the thermal ground plane.

20 Claims, 10 Drawing Sheets

(56) References Cited

U.S. PATENT DOCUMENTS

| | | |
|---|---|---|
| 2007/0215325 A1 | 9/2007 | Solovitz |
| 2008/0128116 A1 | 6/2008 | Dangelo et al. |
| 2009/0056917 A1* | 3/2009 | Majumdar et al. ....... 165/104.26 |
| 2010/0200199 A1* | 8/2010 | Habib et al. ............. 165/104.26 |

* cited by examiner

US 8,807,203 B2

TITANIUM-BASED THERMAL GROUND PLANE

STATEMENT REGARDING FEDERALLY SPONSORED RESEARCH AND DEVELOPMENT

This invention was made with Government support under Grant No. Q9113M-04-01-0001 awarded by the U.S. Army. The Government has certain rights in this invention.

CROSS-REFERENCE TO RELATED APPLICATION

This application claims the benefit under 35 U.S.C. 119(e) of the following co-pending and commonly-assigned U.S. patent application:

U.S. Patent Application Ser. No. 61/082,437, filed on Jul. 21, 2008, by Noel C. MacDonald et al., entitled "TITANIUM-BASED THERMAL GROUND PLANE," which application is incorporated by reference herein.

BACKGROUND OF THE INVENTION

1. Field of the Invention

This invention relates to semiconductor devices, and, more particularly, to thermal ground planes used with semiconductor devices.

2. Description of the Related Art

Electronics employing various semiconductor devices and integrated circuits are commonplace and are subjected to various environmental stresses. Applications of such electronics are extremely widespread, and utilize various different types of semiconductor materials.

Operating environments for electronic devices can be extremely harsh. Large temperature changes, gravitational forces, and shock resistance are required for electronic devices to perform their functions properly. Further, as semiconductor processing and materials have advanced, semiconductor capabilities and heat dissipation have also increased.

Typically, semiconductor devices and integrated circuits are thermally bonded to heat sinks to dissipate heat generated by the semiconductor devices during operation. There are various problems with such approaches, such as ensuring such assemblies can survive the environmental and structural requirements of the operating environment and ensuring that the overall weight and size of the heat sink/device assembly fits within the design envelope of the application. Further, materials used for the heat sink must not adversely affect the device, even though the materials are dissimilar in terms of thermal coefficients of expansion. Such differences usually lead to more complex heat sink designs that are more difficult to incorporate into the application for the semiconductor devices.

It can be seen, then, that there is a need in the art for cooling semiconductor devices.

SUMMARY OF THE INVENTION

The present invention describes a Thermal Ground Plane (TGP) for cooling semiconductor devices, integrated circuits, high-power electronics, radar systems, laser radiation sources, and the like. The TGP is fabricated using Titanium (Ti) and optionally Titania ($TiO_2$) processing technology of the present invention, including Nano-Structured Titania (NST) and wafer-scale processes. Optionally, composite materials using high thermally-conductive materials can be used to increase thermal conductivity. These materials include but are not limited to gold, copper, and the like.

The present invention discloses the micro/nano scale processes that can be used to form NST, which is a super-hydrophilic wick material, on micro-scale, deep etched titanium pillars. An array of Ti or Ti/NST pillars forms a wicking structure for the TGP. The Ti or Ti/NST wicking structure can be tailored to the application by changing the density, position, pitch, spacing (or gap), and height of the deep etched titanium pillars. In addition, the degree of oxidation can be used to tailor the wicking structure. Optionally, composite structures consisting of highly conductive materials can be used to further increase the thermal conductivity of the wicking structure.

The present invention comprises a titanium sheet (or foil) with an integrated array of titanium micro-scale pillars of controlled dimensions, which can be coated with NST, and cavities to support the chips; the top sheet is bonded or laser welded to a second sheet of titanium. The area of the TGP is greatly variable, and can be less than 1 cm×1 cm or greater than 10 cm×20 cm. Very large TGPs can be fabricated, for instance, using large screen LCD processing equipment, and large area etch processes, or other machining techniques.

A thermal ground plane in accordance with the present invention comprises a titanium substrate comprising a plurality of pillars of controlled dimension, wherein the plurality of pillars can be oxidized to form nanostructured titania, and a vapor cavity, in communication with the plurality of titanium pillars, for conducting thermal energy from the titanium substrate.

Such a thermal ground plane further optionally comprises the titanium substrate that can be optionally be thinned in at least part of an area of the substrate opposite the plurality of pillars, the vapor cavity being enclosed using a second substrate (which can optionally be constructed from titanium), the plurality of titanium pillars being formed using optionally titanium inductively-coupled-plasma etching, at least one characteristic of the plurality of pillars can be controlled and optionally varied within the plurality of pillars to adjust a thermal transport of the thermal ground plane, and the at least one characteristic being selected from a group comprising a height, a diameter, a spacing (or gap), an amount of oxidation, a pitch of the plurality of pillars, a composition of the interior pillar regions which may include materials other than titanium, and a composition of material(s) which may include but is not limited to Ti, $TiO_2$, Au, or Cu applied to the pillar surface to control surface physical properties including wettability.

Such a thermal ground plane further optionally comprises the pillars consisting of a composite structure of Ti/Au or Ti/Au/Ti or other suitable materials that can increase the thermal conductivity of the wicking structure.

A method of forming a thermal ground plane in accordance with the present invention comprises etching a titanium substrate to form a plurality of titanium pillars, optionally oxidizing the titanium substrate to form nanostructured titania on the plurality of titanium pillars, and forming a vapor cavity in communication with the plurality of titanium pillars.

Such a method further optionally comprises the titanium substrate that can optionally be thinned in at least part of an area of the substrate opposite the plurality of pillars, the vapor cavity being enclosed using a second substrate (which can optionally be constructed from titanium), the plurality of titanium pillars being formed using optionally titanium-inductively-coupled-plasma etching, at least one characteristic of the plurality of pillars can be controlled and optionally varied within the plurality of pillars to adjust a thermal transport of the thermal ground plane, and the at least one characteristic being selected from a group comprising a height, a diameter, a spacing (or a gap), an amount of oxidation, a pitch of the plurality of pillars, and a composition of material(s) which may include but is not limited to Ti, $TiO_2$, Au, or Cu applied to the pillar surface to control surface physical properties including wettability.

Such a method further optionally comprises the pillars consisting of a composite structure of Ti/Au or Ti/Au/Ti or other suitable materials that can increase the thermal conductivity of the wicking structure.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Titanium is a material that is used in many applications that are subjected to harsh environments, including stealth systems and aerospace vehicles. Commercial applications for titanium include oil well drilling equipment, transportation, shipping, and chemical manufacturing. Titanium and titanium alloys can provide excellent bio-compatibility and have achieved broad acceptance for use in medical and biological applications, including hip replacements, dental implants, and packaging of implant devices, sensors and pacemakers. Micro-machined titanium substrates with integrated Nano-Structured Titania (NST) can also be used to make more robust, shock resistant Thermal Ground Planes (TGPs) including laser welded Ti-TGP packaging.

Micro-machined (i.e. microfabricated) Ti pillars can be manufactured with controlled dimensions (height, diameter, and spacing) to engineer the wicking structure for optimum performance and customized to specific applications. Titanium can be oxidized to form nanostructured titania (NST). Titanium is a material that provides for deposition in conjunction with high-thermally conductive materials. For example, materials such as gold or copper can be electroplated on titanium, and furthermore titanium can be deposited onto gold or copper.

Titanium is one of the few materials that can be microfabricated using cleanroom processing techniques, macro-machined in a machine shop, and laser welded to form a hermetic seal. The combination of these manufacturing techniques creates a unique method for fabricating TGPs.

The present invention describes fabrication of titanium-based Thermal Ground Planes (TGPs). The present invention includes two substrates (of which one or more can be constructed using titanium), one substrate supports an integrated super-hydrophilic wicking structure and a second substrate consists of a deep-etched (or macro-machined) vapor cavity that can optionally be laser welded to the wicking structure to form the TGP.

Schematic View

Figure 1:
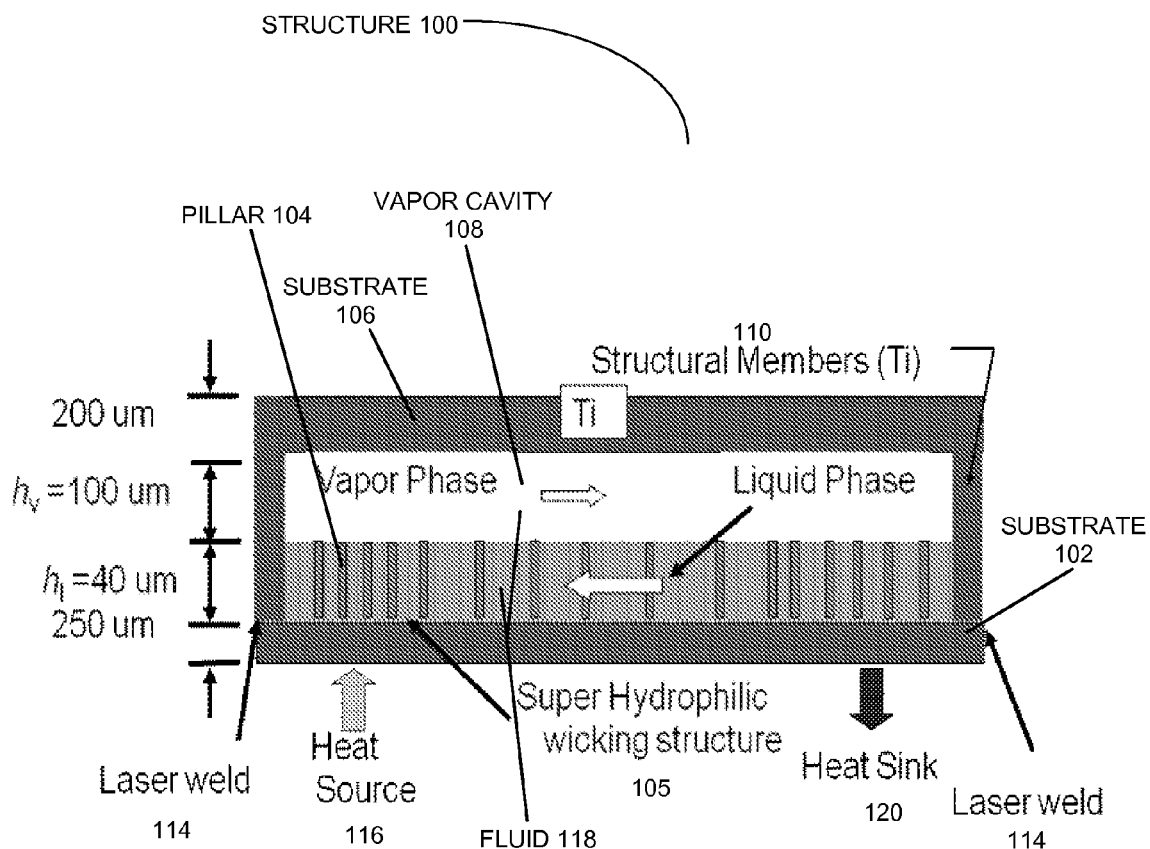
FIG. 1 illustrates a schematic of a preferred embodiment of the Ti-based thermal ground plane of the present invention.

FIG. 1 illustrates a schematic of a preferred embodiment of the Ti-based thermal ground plane of the present invention.

The Thermal Ground Plane (TGP) 100 of the present invention typically comprises a substrate 102, which further comprises pillars 104 that form a wicking structure 105. Typically, the substrate 102 is titanium, and typically the characteristic dimension of the titanium substrate 102 is 25-500 um thick, and can span 1 cm-more than 20 cm in the lateral dimension. In other embodiments, substrate 102 could be formed from other materials, such as but not limited to Al, Cu and the like, either alone or as a composite with titanium.

Typically, the pillars 104 are titanium, but can also be other materials in accordance with the present invention, including nano-structured titania (NST), a composite of titanium with other metals such as gold or copper, or other materials either alone or as a composite with titanium. In the present description, the discussion is with respect to titanium pillars 104, however, it is understood that other materials can be used as well in accordance with the present invention.

The titanium-based pillars 104 are typically nominally 5-200 microns in height, and nominally 5-500 microns in diameter. The spacing between the pillars 104 (i.e. the gap) can be nominally 1-500 microns. These dimensions of the pillars, e.g., height, diameter, and spacing (or gap), are controlled and optionally varied within the plurality of pillars within the TGP 100 in order to maximize TGP performance. For instance, the dimensions can be designed such that viscous losses are minimized and capillary forces are maximized in order to improve TGP performance. Although the dimensions, or characteristics, of the pillars 104 can vary throughout the TGP 100, the characteristics can vary locally within the TGP 100 or can vary from one pillar 104 to another pillar 104, as desired for a given application or use of TGP 100, without departing from the scope of the present invention.

A second substrate 106, and structural members 110 (which can be part of either substrate 102, second substrate 106, or separate members 110), are combined to form a vapor cavity 108. The first substrate 102 is typically processed in accordance with the present invention to create the wicking structure 105. The first substrate 102 and second substrate 106 are, again, typically titanium, however, either substrate 102 or the second substrate 106 can be of a different material, or different materials than each other, if desired.

Typically, the structure 100 is ~1 mm thick, but can be thicker or thinner depending on the desires of the designer or the design requirements of overall structure 100. The thickness of first substrate 102 is typically 25-500 microns.

The super-hydrophilic 3D wicking structure 105 can also comprise titanium pillars 104 and can be optionally coated with $TiO_2$ (Nano-Structured Titania). The pillars 104 in the array 105 can be 5 µm in diameter and 40 µm in height, however, the pillars can be of different diameters and heights depending on the design of structure 100, and the shapes of the pillars can be changed, based on the heat transport characteristics desired or required by structure 100.

The pillars can optionally be constructed from a composite of thermally conductive materials. These materials include but are not limited to Ti, $TiO_2$, Au, or Cu applied to the pillar surface to control surface physical properties including wettability. Typically, vapor cavity 108 is approximately 100-500 µm thick, however, again, this thickness can vary depending on the desires for or requirements of structure 100. For example, wicking structure 105 thermal conductivities of >100 W/mK and wicking inertial force (g-force) of greater than 20 G's are possible with the present invention. The vapor cavity is sealed by second substrate 106, where second substrate 106 hermetically seals the volume described by vapor cavity 108. Hermetic sealing of less than 0.1% fluid loss per year at 100° C. is possible using laser welding 114 of the wicking structure 105 to the second substrate 106, forming vapor cavity 108.

As heat 116 is generated by a heat source, first substrate 102 and wicking structure 105 transfer the heat to the fluid 118, typically water, contained in wicking structure 105 in liquid phase. Heat is transferred to the fluid 118, which transforms the fluid 118 from liquid phase into vapor phase through latent heat of evaporation, transferring the heat from heat source 116, which can be a semiconductor device, high-power electronics, radar systems, laser radiation sources, and the like, or other heat source. The evaporation of fluid 118 from wicking structure 105 creates a region void of liquid in wicking structure 105. This void of liquid creates a capillary force through surface tension that draws liquid through the wicking structure 105, and allows vapor to be transported within the vapor cavity 108 as a result of a pressure gradient. The vapor is transported through the vapor cavity 108. The vapor condenses and returns to a liquid state, thereby releasing the latent heat of evaporation at the location of condensation near heat sink 120. The liquid is then transported through the wicking structure 105 from the cooler region near heat sink 120 towards the hot region near the heat source 116, thereby completing the thermal transport cycle.

Similarly, structure 100 can be designed to transfer heat out of structure 100, e.g., act as a cooling source at one area of structure 100. For example, and not by way of limitation, the heat sink 120 can act as a removal area of heat for a device attached in that area, and the heat source 116 can remove of the heat transferred through vapor cavity 108. In essence, structure 100 can transport thermal energy in either direction, or act as a constant temperature source, for devices attached to structure 100, as desired.

The thickness of substrate 102 can be varied to be thinner at the location of heat source 116 and thinner at the location of heat sink 120, and thicker in other regions, which can be used for increased heat transfer, as a mounting location or indicia for the heat source 116, or other reasons, such as increasing structural integrity, as desired for the application of structure 100. The varied thickness of substrate 102 can also facilitate thermal matching, by reducing thermally-induced stresses imparted by substrate 102 to devices mounted to the TGP. So, for example, thermal matching of 10% for GaAs, Si and GN using the 25 µm thick substrates to support the semiconductor devices is possible within the scope of the present invention. This relatively small thickness of substrate 102 can be supported by thicker beams or pillars that extend from first substrate 102 to second substrate 106 through the vapor cavity 108, if such support is necessary for a given heat source 116. Further, a larger portion or the entirety of substrate 102 can be thinned to any desired thickness to increase thermal transfer if desired or needed for a given application of structure 100.

The titanium pillars 104 can be formed using a variety of methods. In one embodiment, the pillars 104 are etched using inductively-coupled plasma etching from a titanium substrate. In other embodiments, the pillars 104 can be macro-machined from the titanium substrate 102. In other embodiments, the pillars 104 can be grown on top of the titanium substrate 102. In other embodiments, the pillars can be stamped into the titanium substrate. In other embodiments, the pillars can be formed by selective laser ablation.

The TGP 100 is formed by attaching the titanium substrate to a structural backplane, which can be manufactured from a variety of materials. In a preferred embodiment, the structural backplane can be machined from a second titanium substrate 106. The machining process could either be micro-machining or macro-machining. In a preferred embodiment, the two titanium substrates 102 and 106 are laser welded together at welds 114 to form a hermetically-sealed vapor cavity 108.

Again, the vapor cavity 108 typically spans the lateral dimension of the working portion of the TGP 100, but can take various forms as desired. In a preferred embodiment, the vapor cavity 108 can have a depth of 10 microns to several millimeters, with a nominal thickness of 100 microns-1 millimeter. Judicious design of the wicking structure 105 allows for high mass flow rates of fluid 118 to be transported and thereby large amounts of heat to be transported. For example, large height and large spacing of the pillars 104 will reduce viscous losses. In addition, smaller spacing of the pillars 104 will increase capillary forces. Judicious choices of these parameters throughout the TGP 100 will provide optimum TGP 100 performance for a given application of TGP 100.

In some embodiments, the titanium pillars 104 can be oxidized to form nano-structured titania (NST). NST can be used to increase wettability and thereby increase capillary forces, and enhance heat transfer, within TGP 100.

As shown in FIG. 1, structure 100 comprises substrate 102 having a thickness of 250 microns, pillars 104 having a height of 40 microns, a vapor cavity 108 having a height of 100 microns above the pillars 104, and a second substrate 106 having a thickness of 200 microns. Further, pillars 104 are varied in spacing throughout wicking structure 105. These are typical heights and thicknesses for structure 100, and structure 100 can comprise other heights and thicknesses without departing from the scope of the present invention.

Figure 2:
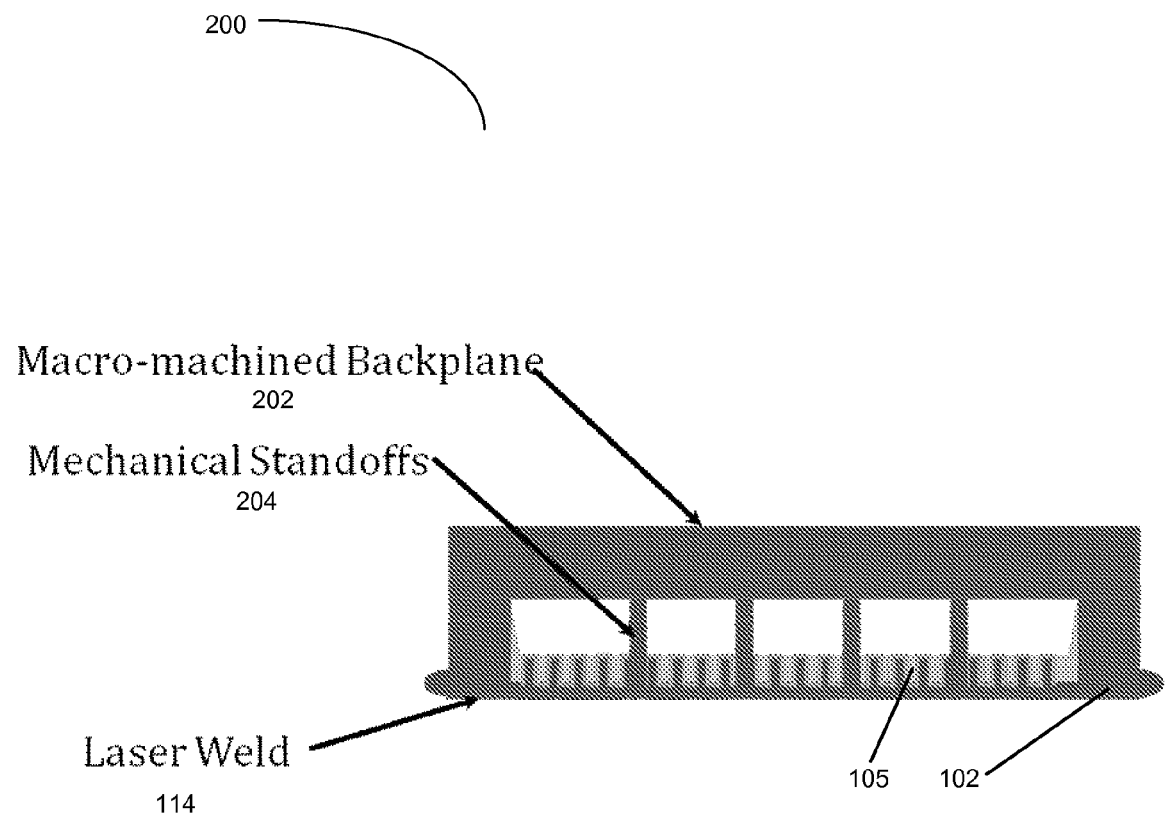
FIG. 2 illustrates a schematic of an embodiment of the Ti-based thermal ground plane in accordance with one or more embodiments of the present invention.

FIG. 2 illustrates a schematic of an embodiment of the Ti-based thermal ground plane in accordance with one or more embodiments of the present invention.

In structure 200, backplane 202, which is typically macro-machined but can be formed using other methods described herein, comprises one or more mechanical standoffs 204, and is attached to substrate 102 to enclose wicking structure 105 and vapor cavity 108. Typically, backplane 202 is laser welded 114 to a micro-fabricated wicking structure 105 on substrate 102, and mechanical standoffs 204 can be bonded to the substrate 102, but other methods of attaching backplane 202 and standoffs 204 can be used if desired. Mechanical standoffs 204 can be designed to increase the structural integrity of structure 200, which can be important for TGPs 200 with large lateral dimensions. Further, the use of mechanical standoffs 204 provides for additional engineering of substrate 102, including thinning substrate 102, since mechanical standoffs 204 allow for additional support of substrate 102 throughout the structure 200.

Figure 3:
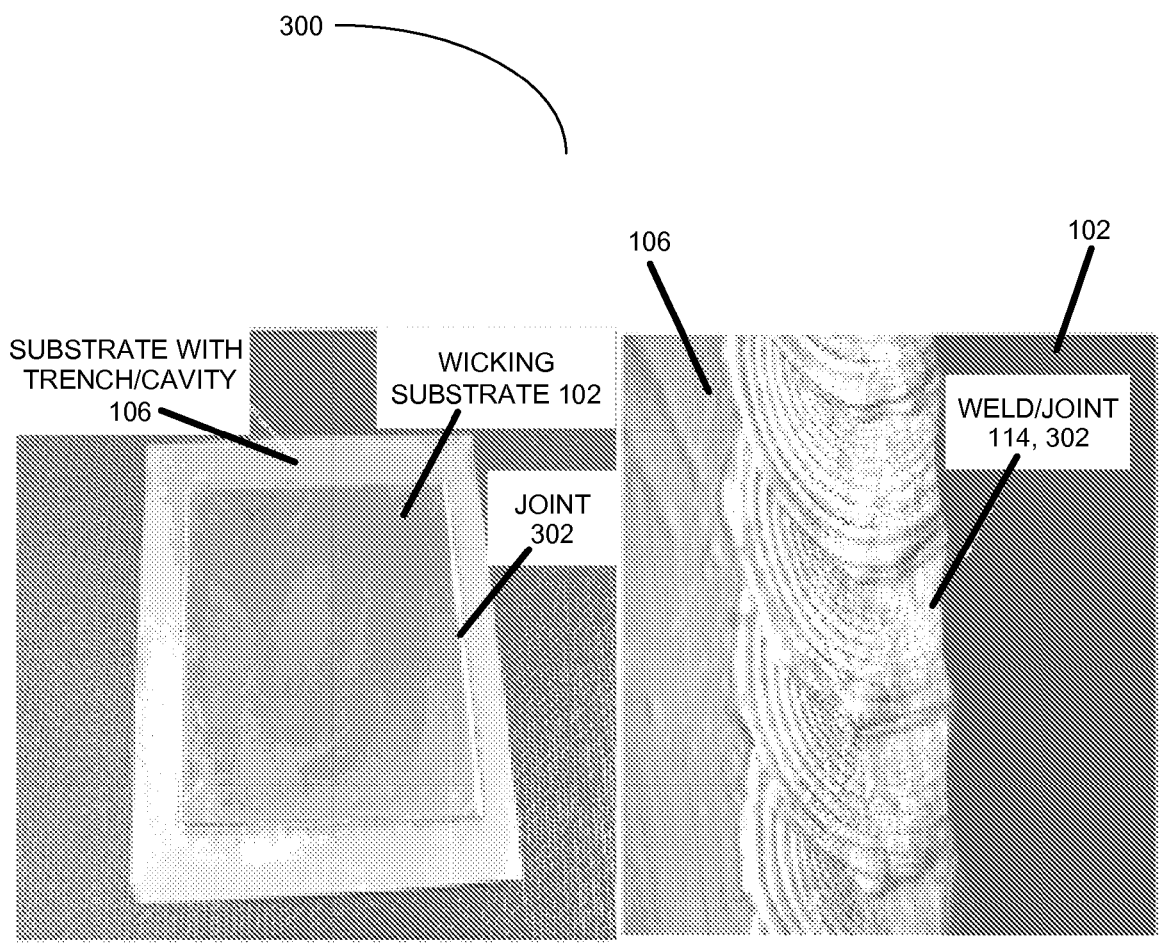
FIG. 3 illustrates a picture of a laser welded Ti thermal ground plane in accordance with one or more embodiments of the present invention.

FIG. 3 illustrates a picture of a laser welded Ti thermal ground plane in accordance with one or more embodiments of the present invention.

Structure 300 is shown, where wicking substrate 102 and joint 302 is shown between wicking substrate 102 and a second substrate 106 is shown. The second substrate 106 can optionally consist of the trench or cavity. Joint 302 is typically a laser weld 114, as shown in detail, to hermetically seal substrate 102 to second substrate 106 and form vapor cavity 108.

For continuous operation, the working fluid and the wicking structure must be in communication with a vapor cavity and sealed such that the internal mechanism of the thermal ground plane 300 is isolated from the external environment to avoid vapor loss and system contamination. The performance of the TGP 300 therefore significantly depends on the quality of packaging. A major problem with conventional packaging techniques for such structures, such as high-temperature thermo-compression and flip chip bonding, is the degradation of reliability caused by the excess stress due to thermal mismatching. To eliminate the stresses which occur at high temperature, laser welding 114 is used to rapidly apply heat at a small region of the joint 302 instead of heating the entire device to hermetically weld the titanium.

In one embodiment, a pulsed wave YAG laser (Neodymium-Doped Yttrium Aluminum Garnet, Nd: Y3Al5O12) with a wavelength of 1064 nm can be used to weld the backplane 106 to the substrate 102. Such a laser can be focused to a very small area, for example 400 microns in diameter, to locally heat the material to the melting point. Given sufficient laser power and linear translation speed, for instance 1.5 J at 2 mm/sec, the substrate 102/backplane 106 joint 302 is welded yet the total energy absorbed is quickly dissipated by the bulk material such that nearby regions of the substrate 102/backplane 106 remain physically unaffected by the heat injected into the device by the welding process.

In other embodiments, other local sources of heat can be used to perform precise welding of the substrate 102 to the backplane 106. For instance, a $CO_2$ or other types of lasers can be used. In another embodiment, a small gap between closely placed electrodes can be used to create a precisely positioned electrical arc which can provide the required heat. In another embodiment, a closely placed electrode can be used to direct an electrical arc between itself and the substrate 102/backplane 106 joint 302, thereby adding the required amount of heat to achieve local welding. In yet another embodiment, substrate 102 and backplane 106 can be thermally bonded by depositing Au on each member and thermally bonding the Au on each member at joint 302.

SEM Images

FIG. 4 is a scanning electron microscope image of the titanium pillar microstructure in accordance with one or more embodiments of the present invention.

Figure 4A:
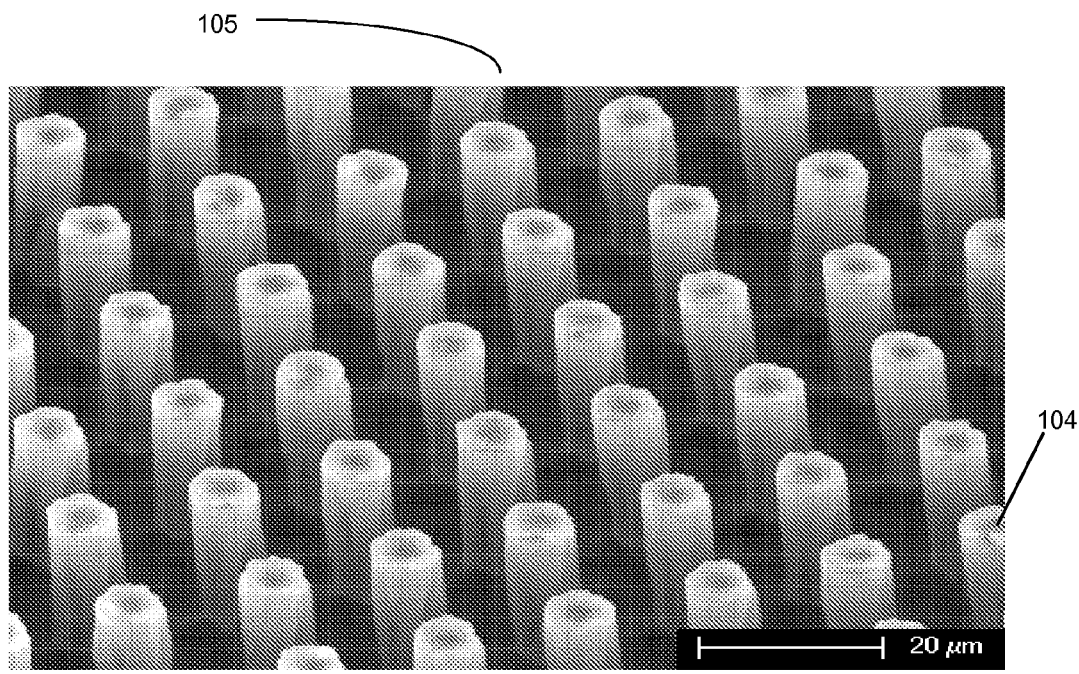
FIG. 4 is a scanning electron microscope image of the titanium pillar microstructure in accordance with one or more embodiments of the present invention: (A) shows array wicking structure, (B) shows some dimensions that can be controlled including height, diameter, and spacing (denoted as gap, g), (C) is a closeup showing the nano-structured-titania (NST)
Figure 4B:
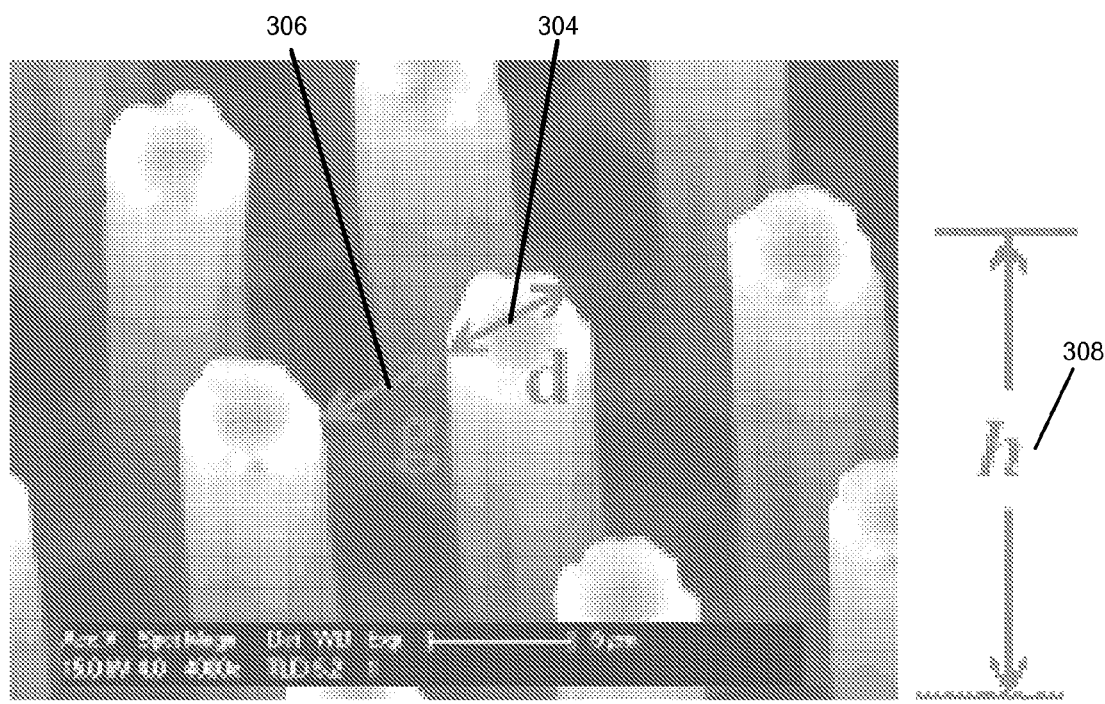

FIG. 4A shows pillars 104 in an array structure to create an embodiment of wicking structure 105. As shown in FIG. 4B, the diameter "d" 304, spacing or gap "g" 306, and height "h" 308 are fairly uniform, however, diameter 304, gap 306, and height 308 of the pillars 104, individually, locally, or collectively can be controlled and/or optionally varied within the structure 100 plurality of pillars to optimize the performance of the TGP 100.

The pillars 104 are arranged in an array such that the diameter 304, spacing 306, and/or height 308 between the pillars 104 are controlled and optionally varied to allow sufficient liquid 118 flow velocity between the pillars 104. The flow velocity of liquid 118 is controlled by reducing viscous losses while simultaneously providing optimal surface area in order to draw the fluid 118 at a proper speed from the cool region 120 to the hot region 116 of the resulting TGP 100. Since the evaporation, adiabatic, and condensation regions of the TGP 100 perform separate functions within the TGP: evaporation, vapor and liquid phases of fluid 118 transport, and condensation, respectively, the pillar geometry, composition, and distribution can be specifically designed to perform optimally in each of these regions. Further, the pillars 104 in the wicking structure 105 can be in an array format, or in any random, pseudo-random, or otherwise structured design without departing from the scope of the present invention.

Figure 4C:
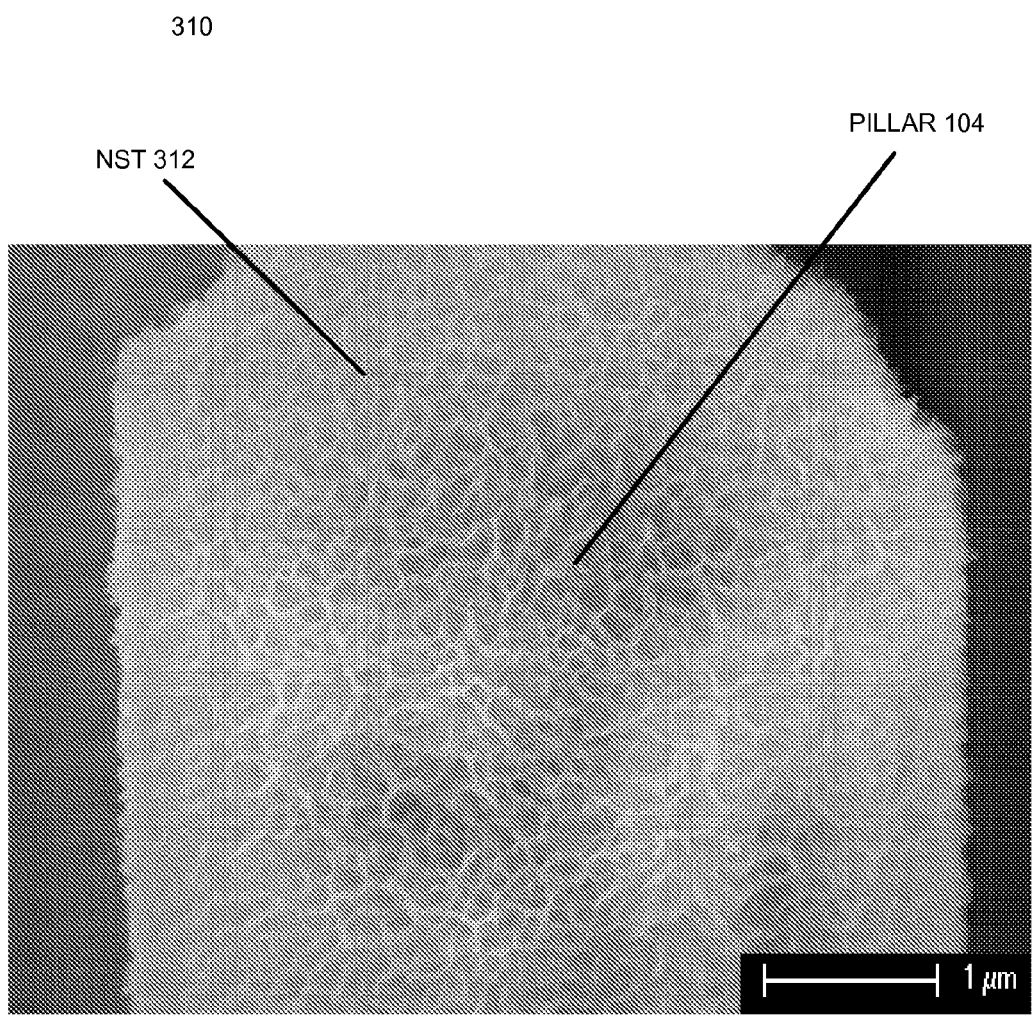

FIG. 4C shows a SEM image 310 of nanostructured titania (NST) 312 etched into a pillar 104. The pillar 104 is oxidized to produce hair-like NST 312 with a nominal roughness of 200 nm. Other embodiments may include NST 312 with a nominal roughness of 1-1000 nm. The hair-like NST 312 structure enhances the wetting properties of Ti pillars 104 which increases the working fluid 118 wetting performance within the wicking structure 105, and the overall heat transport properties of the TGP 100.

Array Processing

Figure 5:
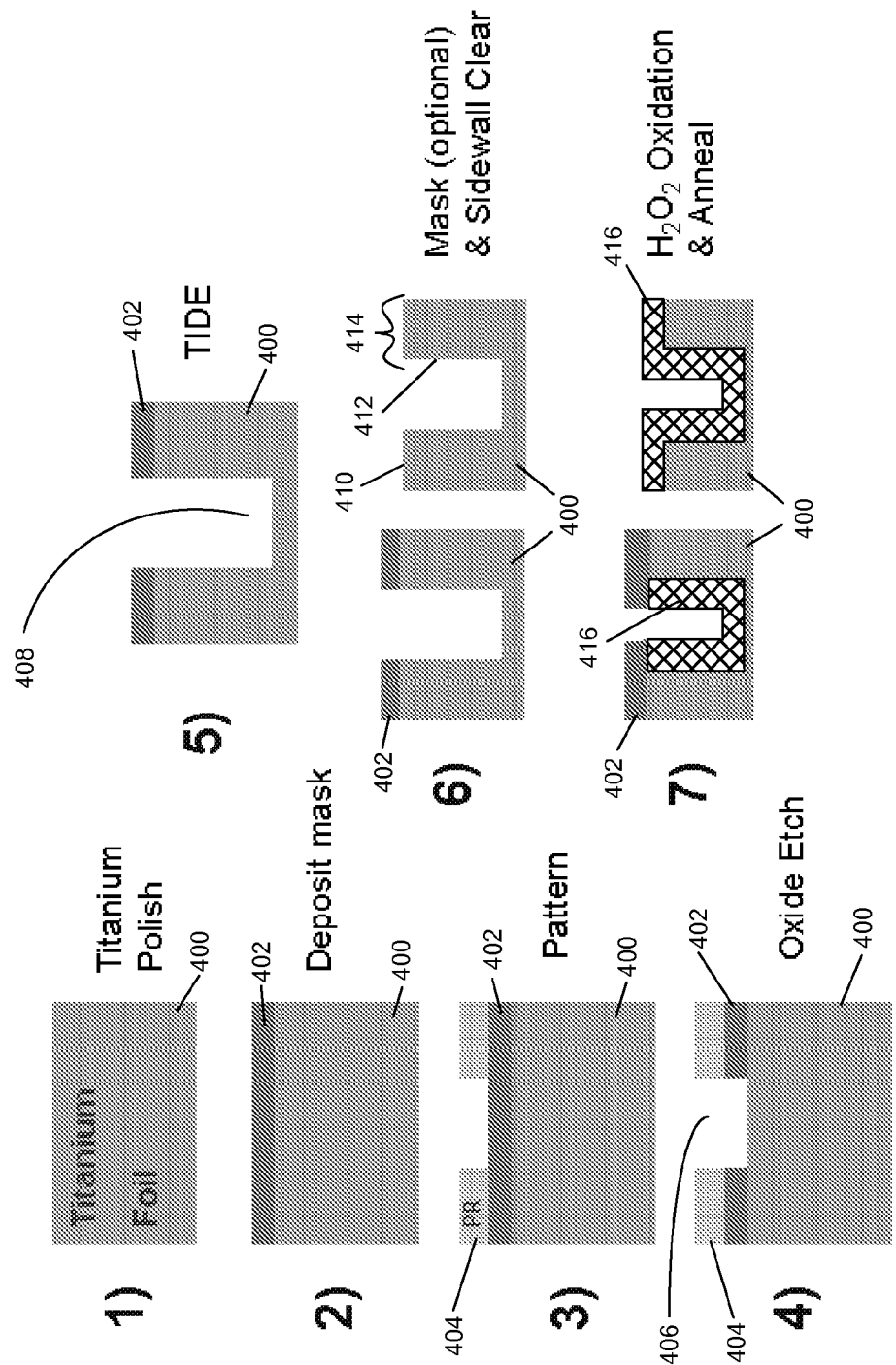
FIG. 5 illustrates side-views of typical processing steps used in accordance with one or more embodiments of the present invention.

FIG. 5 illustrates side-views of typical processing steps used in accordance with the present invention.

Step 1 shows a bulk titanium wafer 400, which is polished sufficiently to allow for the desired lithographic resolution. Step 2 illustrates a masking material 402 that is deposited and patterned. Typical masking materials are $TiO_2$ or $SiO_2$. The masking material 402 is typically an oxide, which is deposited using CVD methods for $SiO_2$ and PVD methods for $TiO_2$. Step 3 illustrates a pattern defined on the surface of masking material 402 using a photoresist 404, and step 4 illustrates an etching 406 to transfer the pattern into the masking material 402.

Step 5 illustrates deeply etching the substrate 400 using etch 408. Etch 408 is typically a Titanium Inductively coupled plasma etching process known as a TIDE process. The TIDE process is described in "Titanium Inductively Coupled Plasma Etching" by E. R. Parker, et al., J. Electrochem. Soc. 152 (2005) pp. C675-83, which is incorporated by reference herein.

Step 6 illustrates masking material 402 being removed from substrate 400. Masking material 402 must be removed if formation of NST is desired on the top surface 410 of substrate 400. Likewise, if NST features are desired on sidewalls 412, etch mask products must be cleared from the sidewalls 412. However, if the formation of NST is not desired on top surface 410, then mask 402 can be left in place if desired. Pillars 414 are now defined within substrate 400. The removal of masking material from top surface 410 and/or sidewalls 412 is typically performed using dry oxide etch chemistries, e.g., $CF_4/O_2$ plasma etching.

Step 7 illustrates substrate 400 being oxidized, which is typically performed in hydrogen peroxide between 80° C.-100° C. NST 416 is then formed on the titanium pillars 414 of substrate 400.

The aspect-ratio (height to width) of pillars 414 and the pitch (angle of the pillars 414 with respect to the substrate 400) can be controlled by etching profiles and techniques, and the hydrophilic capabilities of each pillar 414 can be controlled by the amount and/or depth of NST 416 formed on each pillar 414, e.g., whether the NST 416 is formed on the top surface 410, how long the pillars 414 are oxidized, etc.

Composite Pillar Structure

Figure 6:
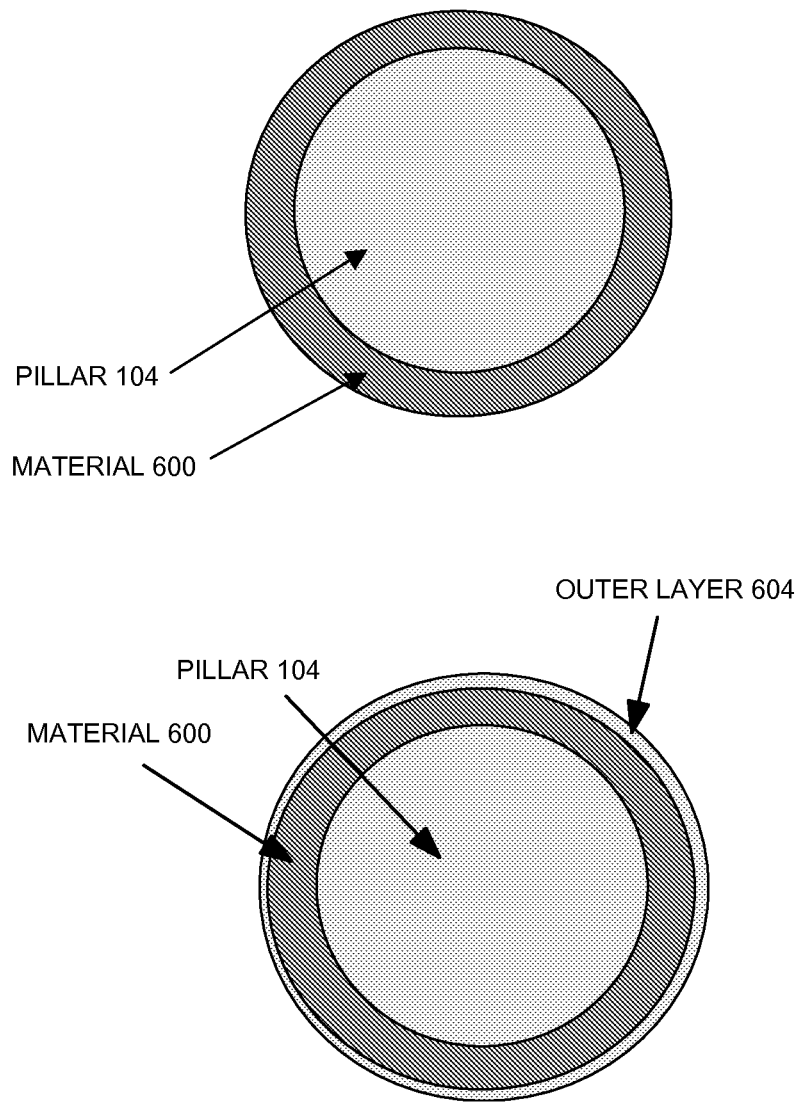
FIG. 6 illustrates alternative composite pillar structure in accordance with one or more embodiments of the present invention.

FIG. 6 illustrates an alternative composite pillar structure in accordance with one or more embodiments of the present invention.

Pillar 104 is shown, which typically comprises titanium. Pillar 104 can be surrounded by a highly thermally conductive material 600, such as but not limited to Au or Cu. Optionally, an outer layer 604 can be added to control wettability, such as but not limited to Ti or nanostructured titania. The use of material 600 and/or outer layer 604 provides flexibility in controlling thermal conductivity and wetting characteristics in the wicking structure 105 independently.

In the hot and cold regions of the TGP 100, heat transfer between the working fluid and the TGP is affected by the thermal conductivity of the pillars 104 in these regions. Since overall TGP 100 performance is improved by a) improving the wetting speed of the working fluid 118, and b) improving the heat transfer properties of the pillar array 105, these parameters can be optimized independently to optimize TGP performance.

Since wetting speed can be improved by providing a super hydrophilic surface on the outside area of the pillars 104, a rough surface such as that arising from oxidized Ti NST 604 can be added to each pillar 104 as shown in FIG. 6. However, since neither NST nor Ti provides optimal heat conduction through the volume which they comprise, a material 600 layer of Au or other material of improved heat transfer properties can be in communication with the Ti or NST outer layer 604 to improve the heat transport properties of each pillar 104.

Materials providing improved pillar 104 heat transfer properties can be added by, for example, thermal evaporation processes such as those driven by either tungsten filament heaters or electron beam sources; molecular beam epitaxy, chemical vapor deposition processes, or electroplating processes, or other methods.

In one embodiment, a concentric layer of Au or other heat-conducting material 600 can be added between the outer Ti/NST layer 604 and an inner core of Ti pillar 104. In another embodiment, a Ti/NST layer 604 can be added to a pillar 104 consisting entirely of Au or other heat-conducting material 600. In another embodiment, a Ti/NST layer 604 can be added to a microcomposite structure comprised at least partially of Au or Cu or other thermally-conducting material.

Wetting Speeds

Figure 7:
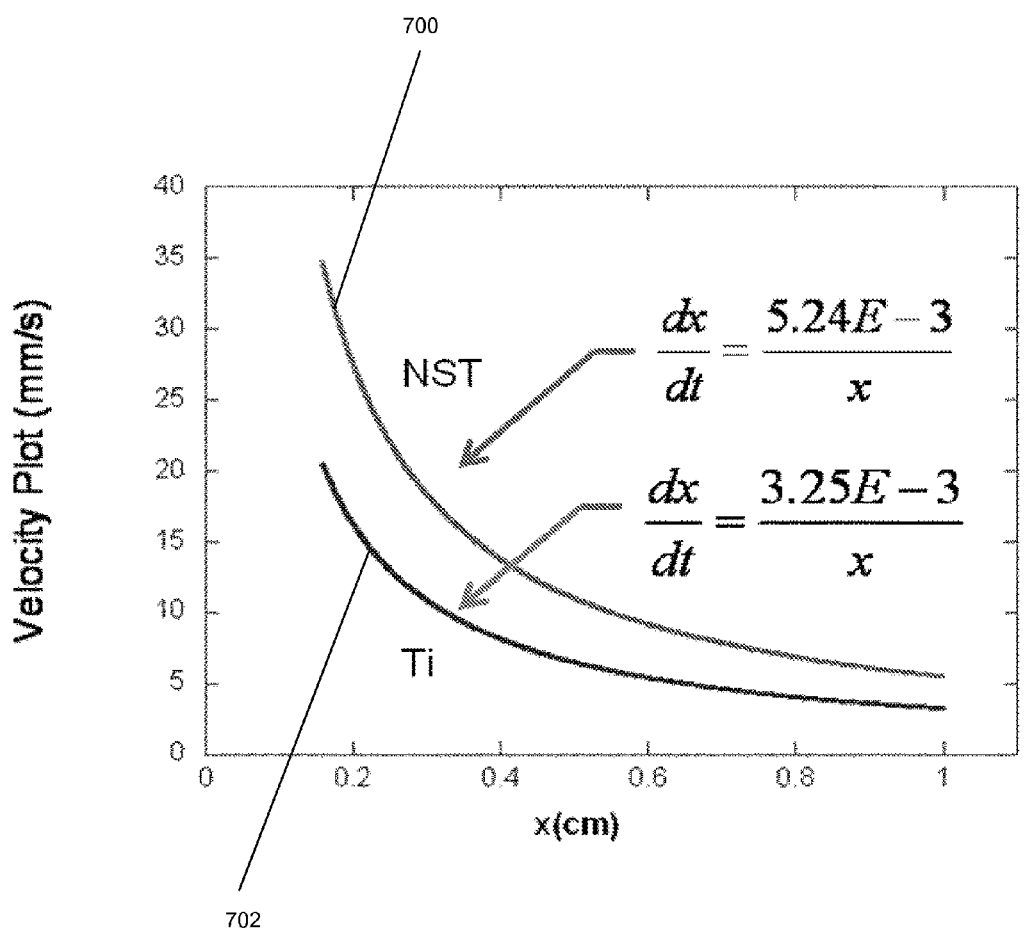
FIG. 7 illustrates a plot of characteristic wetting speeds in a typical wick embodiment of the present invention.

FIG. 7 illustrates a plot of characteristic wetting speeds in a typical wick embodiment of the present invention.

FIG. 7 illustrates results 700 of an NST pillar 104 array, show a 70% increase in wetting velocity when using NST coated pillars. Characteristic speeds are of order centimeters per second. Results 702 show a titanium pillar 104 array wetting velocity.

Heat transport from the hot to cool region of the TGP 100 is provided by evaporation of liquid-phase fluid 118 into vapor-phase fluid 118, and the transport of vapor-phase fluid 118 from hot region 116 to the cold region 120 of the substrate 102. Simultaneously, the liquid-phase of fluid 118 is transported through wicking structure 105 from cold region 120 to hot region 116, which results from capillary forces, thereby completing the fluid transport cycle for transport of heat through the TGP. The wetting speed of fluid 118 through wicking structure 105, coupled with the height 308 of the wicking structure 105, determines the rate of mass transfer of fluid 118, and therefore the maximum rate at which heat can be transported through the TGP 100.

The heat transfer properties of the TGP 100 are therefore affected by the wetting speed of liquid-phase fluid 118 through wicking structure 105 (which is in communication with wicking substrate 102), whereby higher wetting speeds provide higher thermal transport of the TGP 100.

The wetting speed through wicking structure 105 was determined by observation. Wetting speed follows the Washburn equation which describes the associated wetting dynamics for the case of $\theta=0°$. The wetting speed decreases with increasing wetting distance x as expected, due to increasing viscous resistance as the wetting path becomes larger. The NST-coated pillars 104 improve substrate wetting speed over the entire range of wetting distance x in comparison to pillars 104 which are not coated with NST. This indicates the application of NST to the pillars will improve the heat transport properties of the TGP.

Effective Thermal Conductivity

Figure 8:
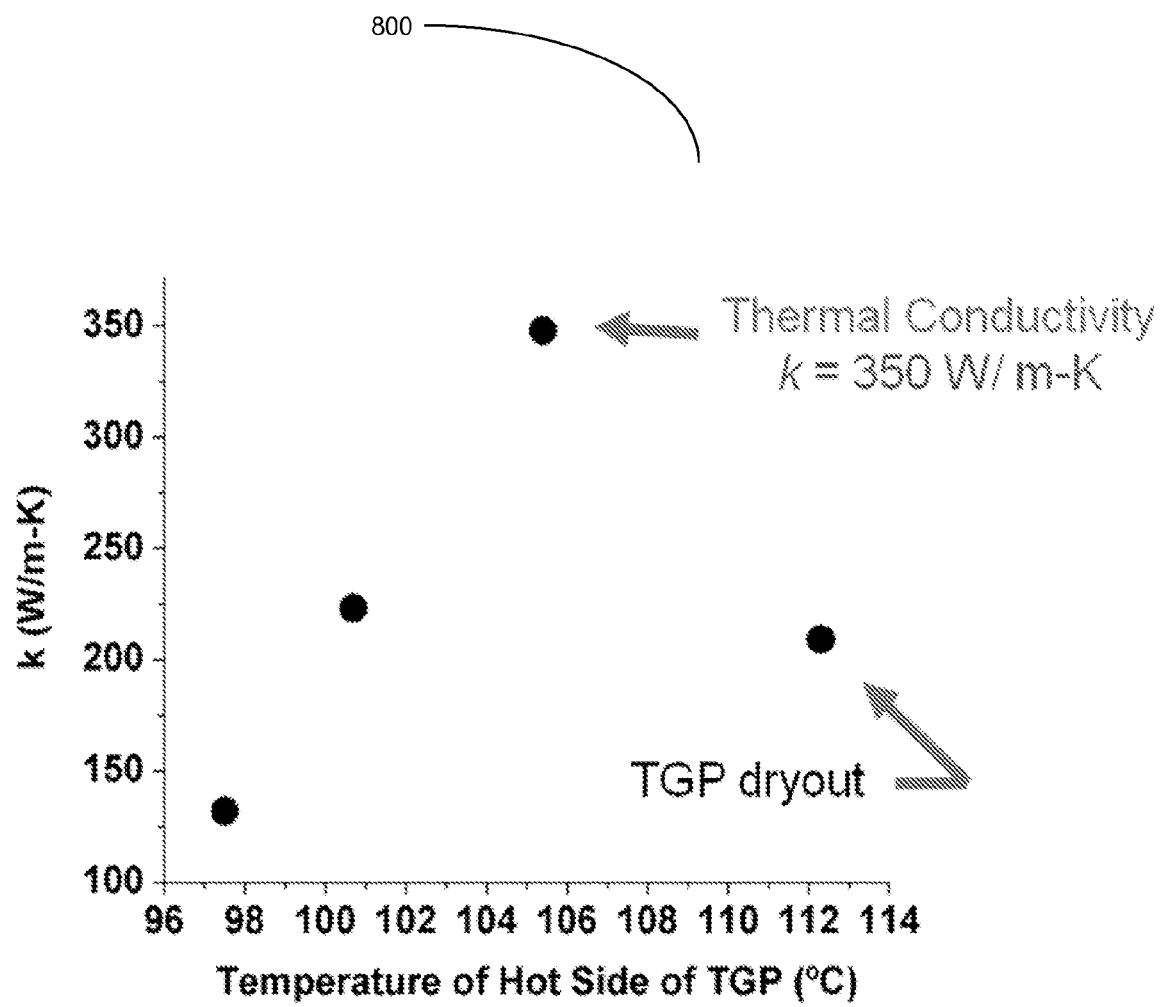
FIG. 8 illustrates a plot of effective thermal conductivity of the TGP as a function of temperature at the heat source in accordance with one or more embodiments of the present invention.

FIG. 8 illustrates a plot of the effective thermal conductivity of the TGP as a function of temperature at the heat source in accordance with one or more embodiments of the present invention.

Graph 800 shows heat carrying capacity of a TGP 100 embodiment comprised of Ti pillars 104 coated with NST, and was evaluated by holding the hot region (i.e. hot side) 116 of the TGP 100 at several temperatures while maintaining the temperature of the cold region (i.e. cold side) 120 of the TGP 100 constant. Effective thermal conductivity k of the TGP 100 increases as temperature is increased on the hot region (side) 116 of the TGP 100. In the depicted TGP 100 configuration, heat pipe 'dryout' occurs at temperatures greater than 105 C. Dryout occurs due to the lack of capillary-driven flow of liquid-phase fluid 118 through wicking structure 105 sufficient to replenish the evaporated fluid 118 at hot region 116. By varying the design parameters of the TGP 100, including pillar 104 diameter 304, height 308, and spacing 306, the dryout temperature and overall heat carrying capacity of the TGP 100 can be optimized for various applications. In one embodiment, at least one parameter of the TGP 100 design can be controlled and optionally varied within the plurality of pillars 104 to increase or decrease the dryout temperature to match a particular application. In another embodiment, at least one parameter of the TGP 104 design can be controlled and optionally varied within the plurality of pillars 104 to increase or decrease the overall heat carrying capacity of the TGP to match a particular application.

This demonstrates that the TGP 100 of the present invention can achieve at least 350 W/m-K of effective thermal conductivity.

Modeling of the Invention

The performance of the NST wicking structure and the packaged TGP has been modeled using computer software. The TGP of the present invention uses micro-scale NST coated Ti pillars as the wicking structure. The distribution and density of the pillars 104 that form the wicking structure 105 are variables that determine the performance of the TGP structure 100. By using simulation and modeling for a number of pillar-array designs, the present invention can produce designs that deliver optimal effective thermal conductivity across the entire wicking structure, or optimized for specific locations of one or a plurality of hot regions 116 and one or a plurality of cold regions 120 on substrate 102.

Numerical simulations of the capillary-driven fluid motion, vapor-phase transport, heat transfer, and stress analysis was performed using COMSOL Multiphysics (COMSOL, Stockholm, Sweden) finite element software. The capillary-driven fluid motion through the NST wicking structure 105 was modeled using surface tension, the Navier-Stokes equation, and continuity. The level-set method was used to model the liquid/vapor interface. The rate of liquid evaporation multiplied by the heat of vaporization was balanced with the heat adsorbed inside the TGP. This rate was used as a sink term for the conservation of mass equation of the liquid phase, and as a source term for the conservation of mass equation of the vapor phase.

The vapor-phase transport was modeled using the Navier-Stokes equation. At the cool end of the TGP, the rate of condensation divided by the heat of evaporation was balanced by the rate of condensation and the source/sink terms for the mass conservation equations of the liquid/vapors phases, respectively. The temperature distribution was modeled using the energy conservation equation. The simulation model was correlated with experiments to understand transport mechanisms. The results can be used to optimize the performance of the TGP for a variety of geometries and operating conditions.

Simulations on thermal mismatch were also performed to determine the suitability of a given TGP design for a specific application. The thermal expansion coefficients (TEC) for semiconductor materials vary significantly, for example (in units of $1e^{-6}/°C.$), Silicon is 2.6, GaAs is 6.9, and GaN is 3.2. Unfortunately, the TECs do not match well with potential conducting materials for TGPs, e.g., titanium (Ti) is 8.5, copper (Cu) is 13.5, and aluminum (Al) is 23. In order to minimize thermally-induced stresses between the TGP and the semiconductor-based device, it is desirable to match the TEC between the TGP and the chip within 1%.

The TECs are material specific. In principle, it may be possible to design a TGP that thermally matches one semiconductor, such as Si, however, it would be very difficult to design a universal TGP that can match several different semiconductor materials simultaneously. Instead of matching TECs directly, the present invention uses an alternative approach that universally reduces thermally induced stresses for all semiconductor materials, simultaneously.

The induced stress from two dissimilar materials bonded together can be approximated to first order (Eq. 1) by: (a) assuming the materials do not bend appreciably, (b) matching the total strain (i.e. the strain due to thermal expansion and the strain due to normal stress), and (c) equating equal and opposite forces due to normal stresses, such as $\sigma_1 t_1 = -\sigma_2 t_2$, where $\sigma_1$ & $\sigma_2$ are the normal stress from material 1 & 2, respectively. The thickness of materials 1 & 2 are denoted by $t_1$ & $t_2$, respectively.

$$\sigma_1 = (\alpha_2 - \alpha_1)\Delta T \left[ \frac{1}{E_1} + \frac{1}{E_2}\frac{t_1}{t_2} \right]^{-1} \quad (1)$$

As an example, if material 1 is the semiconductor chip, and material 2 is the TGP, for a given temperature change, $\Delta T$, the normal stress in the semiconductor can be reduced by a number of factors. Clearly, one way to reduce $\sigma_1$ is to reduce the thermal mismatch, $(\alpha_2 - \alpha_1)$.

However, the present invention utilizes another method, which is to reduce thermally-induced stresses by maximizing the ratio $t_1/t_2$. Since Ti is a ductile material, with moderate strength, and is durable and corrosion resistant, it can be micromachined with ~25 μm thick layers that interface with the semiconductor chip, while maintaining structural integrity. This not only provides efficient heat conduction from the chip to working fluid inside the TGP, but dramatically decreases thermal stresses, for all types of semiconductor materials simultaneously.

Considering a challenging scenario, where the temperature difference is $\Delta T=50°$ C., and assuming a $t_1=500$ μm thick Si wafer (chip 110) is bonded to a $t_2=1$ mm thick solid Cu TGP. From Eq. (1), the induced thermal stress in the Si chip would be $\sigma_1=54$ MPa. By comparison, the same $t_1=500$ μm thick Si wafer bonded to a $t_2=25$ μm thick Ti sheet (first substrate 102) would induce a thermal stress in the Si chip of $\sigma_1=1.5$ MPa, which is a 36 fold reduction in stress, compared to the solid 1 mm thick Cu substrate.

For reference, $\sigma_1=1.5$ MPa is the same level of thermally-induced stress that a 1 mm thick Cu substrate would impart on the same Si chip, if its effective TEC was only $\alpha_{eff}=2.8$, which is similar (within 8%) to the actual TEC for Si, $\alpha_{Si}=2.6$. Further, the titanium sheet would weigh less than the comparable copper thermal ground plane, which makes the approach of the present invention more desirable in applications where weight is a factor, e.g., space flight.

Similar results are derived for other semiconductor materials. The effective TEC of the $t_2=25$ μm Ti TGP for GaN ($\alpha_{GaN}=3.4$) is $\alpha_{eff}=3.4$ (i.e. matches GaN to within 6.3%). Similarly, the effective TEC of the Ti TGP for GaAs ($\alpha_{GaAs}=6.9$) is $\alpha_{eff}=7.03$ (i.e. matches GaAs to within 1.8%).

In order to access the applicability of Eq. (1) to describe the thermally-induced stresses that our proposed Ti-based TGP would impart on a Si chip, a 2-D numerical simulation was conducted (*COMSOL Multiphsyics V*3.3; COMSOL, Inc., Stockholm, Se) to estimate a typical temperature distribution in the TGP.

Process Chart

Figure 9:
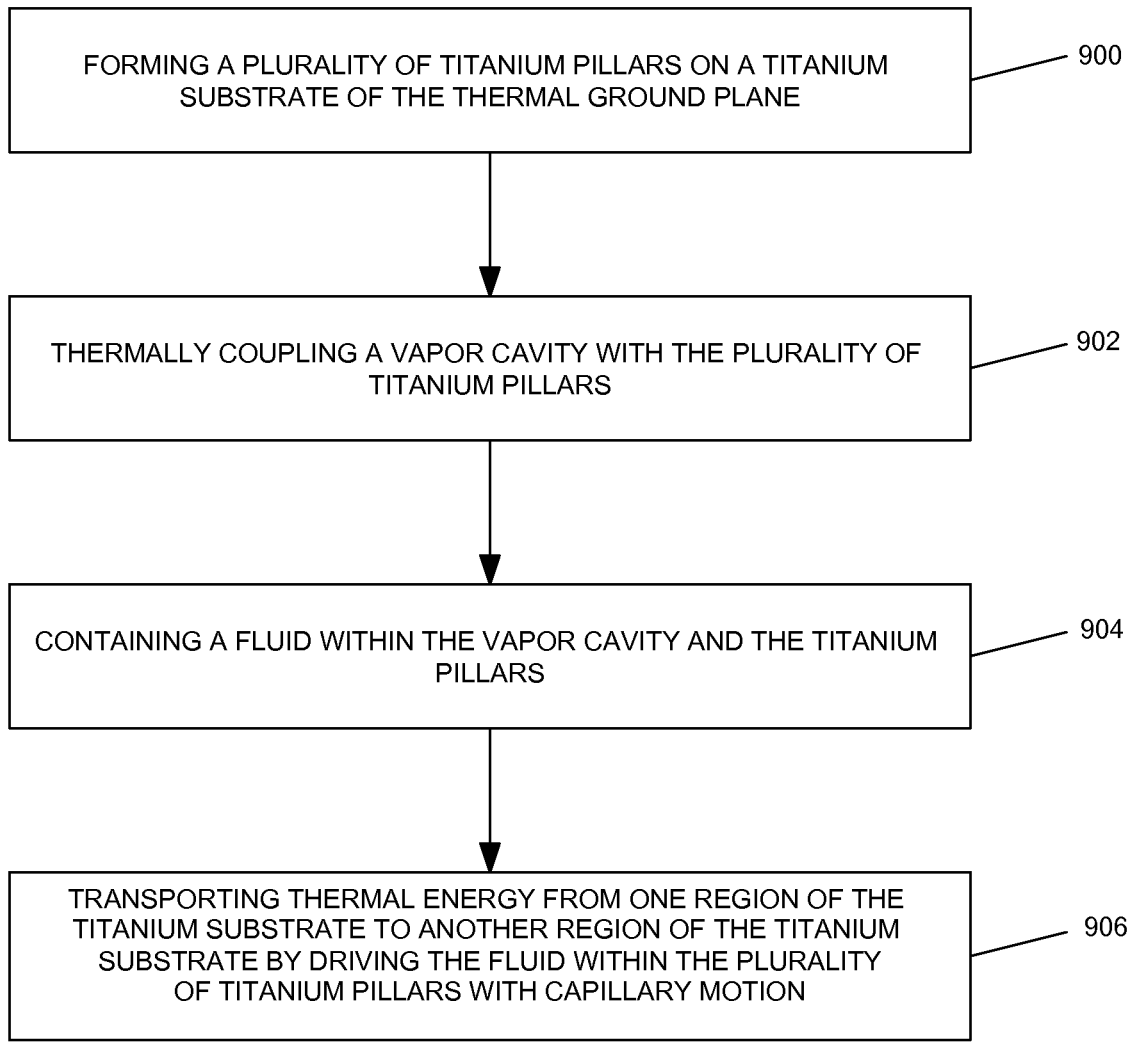
FIG. 9 illustrates a flow chart of the formation of one or more embodiments of the Ti-based TGP in accordance with the present invention.

FIG. 9 illustrates a flow chart of the formation of one or more embodiments of the Ti-based TGP in accordance with the present invention.

Box 900 illustrates forming a plurality of titanium pillars on a titanium substrate.

Box 902 illustrates thermally coupling a vapor cavity with the plurality of titanium pillars.

Box 904 illustrates containing a fluid within the vapor cavity and the titanium pillars.

Box 906 illustrates transporting thermal energy from one region of the titanium substrate to another region of the titanium substrate by driving the fluid within the plurality of titanium pillars with capillary motion.

Advantages of the Present Invention

Titanium provides several material properties that are desirable in terms of fracture toughness, strength-to-weight ratio, corrosion resistance, and bio-compatibility. For example, titanium has a fracture toughness almost ten times that of diamond, and over 50 times that of silicon. Further, titanium is easily machined on both a macro and micro scale, and can be welded easily to form hermetically sealed structures.

Further, titanium can be oxidized to form NST, which can increase the hydrophilicity of the wicking structure, and can be electroplated with various materials to increase the thermal conductivity of the wicking structure, which provides for extreme design flexibility in the design of the wicking structure properties and characteristics.

Because titanium has a high fracture toughness, low coefficient of thermal expansion compared to other metals, and a low modulus of elasticity, the structure 100 can be manufactured to comply thermally and physically with a large number of devices, including semiconductor devices, and the control of the dimensions and materials used within wicking structure 105 allows for engineering of the performance of the wicking structure 105 for a wide range of applications.

However, the low thermal conductivity of titanium as compared to other materials, e.g., copper, gold, silicon carbide, etc., has previously made titanium a poor choice for use as a heat transfer mechanism or as a thermal ground plane. Peer review of the present invention, when proposed as a research project, resulted in a rejection of the use of titanium as unpractical in thermal ground plane applications. However, the present invention shows that despite the low thermal conductivity of titanium, the use of pillars 104, various composite materials within the wicking structure 105, and the controllability and the option to vary the of the size, shape, spacing (or gap), and pitch of the pillars 104 within the plurality of pillars allows titanium to overcome the previously thought of deficiencies.

CONCLUSION

The present invention describes titanium-based thermal ground planes. A thermal ground plane in accordance with the present invention comprises a titanium substrate comprising a plurality of pillars, wherein the plurality of Ti pillars can be optionally oxidized to form nanostructured titania coated pillars, and a vapor cavity, in communication with the plurality of titanium pillars, for transporting thermal energy from one region of the thermal ground plane to another region of the thermal ground plane. Such a thermal ground plane further optionally comprises the titanium substrate that can optionally be thinned in at least part of an area of the substrate opposite the plurality of pillars, the vapor cavity being enclosed using a second substrate (which can optionally be constructed from titanium), the plurality of titanium pillars being formed using optionally titanium inductively-coupled-plasma etching, at least one characteristic of the plurality of pillars can be controlled and optionally varied within the plurality of pillars to adjust a thermal transport of the thermal ground plane, and the at least one characteristic being selected from a group comprising a height, a diameter, a spacing (or a gap), an amount of oxidation, a pitch of the plurality of pillars, and a composition of material(s) which may include but is not limited to Ti, $TiO_2$, Au, or Cu applied to the pillar surface to control surface physical properties including wettability.

A method of forming a thermal ground plane in accordance with the present invention comprises etching a titanium substrate to form a plurality of titanium pillars, optionally oxidizing the titanium substrate to form nanostructured titania on the plurality of titanium pillars, and forming a vapor cavity in contact with the plurality of titanium pillars.

Such a method further optionally comprises the titanium substrate that can optionally be thinned in at least part of an area of the substrate opposite the plurality of pillars, the vapor cavity being enclosed using a second substrate (which can optionally be constructed from titanium), the plurality of titanium pillars being formed using optionally titanium inductively-coupled-plasma etching, at least one characteristic of the plurality of pillars being controlled and optionally varied to adjust a thermal transport of the thermal ground plane, and the at least one characteristic being selected from a group comprising a height, a diameter, a spacing (or gap), an amount of oxidation, a pitch of the plurality of pillars, and a composition of material(s) which may include but is not limited to Ti, $TiO_2$, Au, or Cu applied to the pillar surface to control surface physical properties including wettability.

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A thermal ground plane, comprising:
   a titanium substrate comprising a plurality of etched pillars, forming a wicking structure wherein one or more of the pillars have a height of 5-200 micrometers, a diameter of 5-500 micrometers, and a spacing of 1-500 micrometers;
   a vapor cavity, in communication with the plurality of titanium pillars; and
   a fluid contained within the wicking structure and vapor cavity for transporting thermal energy from one region of the thermal ground plane to another region of the thermal ground plane, wherein the fluid is driven by capillary forces within the wicking structure.

2. The thermal ground plane of claim 1, wherein a pillar in the plurality of pillars comprises dimensions between one micron and one millimeter.

3. The thermal ground plane of claim 1, further comprising a second titanium substrate, wherein the vapor cavity is enclosed by the titanium substrate and the second titanium substrate.

4. The thermal ground plane of claim 3, wherein the titanium substrate is laser welded to the second titanium substrate to form a hermetically-sealed vapor cavity.

5. The thermal ground plane of claim 1, wherein at least one characteristic of each pillar in the plurality of pillars is controlled to adjust the transport of thermal energy within the thermal ground plane.

6. The thermal ground plane of claim 5, wherein the at least one characteristic is selected from a group comprising:
   a height of each pillar in the plurality of pillars, a diameter of each pillar in the plurality of pillars, a spacing between each pillar in the plurality of pillars, an amount of oxidation of each pillar in the plurality of pillars, and a pitch of each pillar in the plurality of pillars.

7. The thermal ground plane of claim 6, wherein the at least one characteristic of each pillar in the plurality of pillars is varied within the plurality of pillars.

8. The thermal ground plane of claim 1, wherein at least a portion of the pillars in the plurality of pillars comprises a composite of titanium with a thermally conductive material.

9. A method for making a thermal ground plane, comprising:
   etching a plurality of titanium pillars on a titanium substrate of the thermal ground plane, wherein one or more of the pillars have a height of 5-200 micrometers, a diameter of 5-500 micrometers, and a spacing of 1-500 micrometers;
   thermally coupling a vapor cavity with the plurality of titanium pillars;
   containing a fluid within the vapor cavity and the titanium pillars; and
   transporting thermal energy from one region of the titanium substrate to another region of the titanium substrate by driving the fluid within the plurality of titanium pillars with capillary motion.

10. The method of claim 9, wherein the etching comprises an inductively coupled plasma etching process.

11. The method of claim 9, further comprising pulse laser welding the titanium substrate to a second titanium substrate to form the vapor cavity that is hermetically-sealed, without introducing excess thermal stresses.

12. The thermal ground plane of claim 1, wherein the titanium substrate spans at least 10 cm in a lateral dimension.

13. A thermal ground plane, comprising:
- a titanium substrate comprising a plurality of etched pillars, forming a wicking structure, wherein a surface of at least one pillar in the plurality of pillars is oxidized to produce hair-like nanostructured titania (NST), which provides a superhydrophilic property;
- a vapor cavity, in communication with the plurality of titanium pillars; and
- a fluid contained within the wicking structure and vapor cavity for transporting thermal energy from one region of the thermal ground plane to another region of the thermal ground plane, wherein the fluid is driven by capillary forces within the wicking structure.

14. The thermal ground plane of claim 1, wherein the plurality of etched pillars are etched using an inductively coupled plasma etching process.

15. The thermal ground plane of claim 14, wherein the plurality of etched pillars are etched using a Titanium Inductively Coupled plasma Etching (TIDE) process.

16. The thermal ground plane of claim 15, wherein the titanium substrate is laser welded to a second titanium substrate to form the hermetically-sealed vapor cavity, without introducing excess thermal stresses.

17. The thermal ground plane of claim 1, wherein the thermal ground plane has a thickness of 590 micrometers or more.

18. The thermal ground plane of claim 1, wherein the titanium substrate has a thickness of 25-500 microns.

19. The thermal ground plane of claim 13, wherein at least a portion of the pillars in the plurality of pillars comprises a composite of titanium with a thermally conductive material.

20. The thermal ground plane of claim 13, wherein at least a portion of the pillars in the plurality of pillars comprises a composite of titanium with at least one metal selected from gold and copper.

\* \* \* \* \*

UNITED STATES PATENT AND TRADEMARK OFFICE
CERTIFICATE OF CORRECTION

| | | |
|---|---|---|
| PATENT NO. | : 8,807,203 B2 | Page 1 of 1 |
| APPLICATION NO. | : 13/055111 | |
| DATED | : August 19, 2014 | |
| INVENTOR(S) | : MacDonald et al. | |

It is certified that error appears in the above-identified patent and that said Letters Patent is hereby corrected as shown below:

In the Specification

Column 1

Line 8, please delete "This invention was made with Government support under Grant No. Q9113M-04-01-0001 awarded by the U.S. Army."

and insert --This invention was made with Government support under Grant No. W9113M-04-01-0001 awarded by the U.S. Army.--

Signed and Sealed this
Twenty-third Day of December, 2014

Michelle K. Lee
*Deputy Director of the United States Patent and Trademark Office*